(12) United States Patent
Ershov

(10) Patent No.: US 7,910,394 B1
(45) Date of Patent: Mar. 22, 2011

(54) PHOTODIODE WITH IMPROVED CHARGE CAPACITY

(75) Inventor: Maxim Ershov, Cupertino, CA (US)

(73) Assignee: Foveon, Inc., Santa Clara, CA (US)

( * ) Notice: Subject to any disclaimer, the term of this patent is extended or adjusted under 35 U.S.C. 154(b) by 308 days.

(21) Appl. No.: 12/060,702

(22) Filed: Apr. 1, 2008

(51) Int. Cl.
*H01L 21/00* (2006.01)

(52) U.S. Cl. ......... 438/75; 438/56; 438/57; 438/70; 438/79; 438/91; 257/457; 257/463; 257/465

(58) Field of Classification Search ............ 438/56, 438/57, 70, 75, 91, 79; 257/457, 463, 465
See application file for complete search history.

(56) References Cited

U.S. PATENT DOCUMENTS

| | | | | |
|---|---|---|---|---|
| 4,396,438 A | * | 8/1983 | Goodman | 438/75 |
| 4,579,626 A | * | 4/1986 | Wallace | 438/79 |
| 5,466,954 A | * | 11/1995 | Aizpuru et al. | 257/187 |
| 6,204,087 B1 | * | 3/2001 | Parker et al. | 438/56 |
| 6,455,345 B1 | * | 9/2002 | Tanabe | 438/60 |
| 2002/0048837 A1 | * | 4/2002 | Burke et al. | 438/48 |
| 2005/0224844 A1 | * | 10/2005 | Mizuguchi | 257/233 |

FOREIGN PATENT DOCUMENTS

KR 1020060020850 * 3/2006

OTHER PUBLICATIONS

Segal ("3D-A new architecture for solid-state radiation detectors", ICFA Instrumentation Bulletin, pp. 30-48, vol. 14, 1997).*

* cited by examiner

*Primary Examiner* — Charles D Garber
*Assistant Examiner* — Yasser A Abdelaziez
(74) *Attorney, Agent, or Firm* — Lewis and Roca LLP

(57) ABSTRACT

A method for forming a photodiode cathode in an integrated circuit imager includes defining and implanting a photodiode cathode region with a photodiode cathode implant dose of a dopant species and defining and implanting an edge region of the photodiode cathode region with a photodiode cathode edge implant dose of a dopant species to form a region of higher impurity concentration than the photodiode cathode impurity concentration.

21 Claims, 7 Drawing Sheets

Pixel Well

Pixel Well

Pixel Well

US 7,910,394 B1

PHOTODIODE WITH IMPROVED CHARGE CAPACITY

BACKGROUND OF THE INVENTION

1. Field of the Invention

The present invention relates to active pixel sensors. More particularly, the present invention relates to lateral doping profile engineering for improving the trade-off between pixel well capacity and depletion voltage.

2. The Prior Art

A current trend in pixel sensor arrays is scaling the array to increase device density and decrease die size. As pixels scale, well capacity decreases because of the smaller pixel area. A decreased well capacity erodes the dynamic range of the imager. It is known that well capacity can be improved by increasing the pixel area, but this goes against the scaling trend. Well capacity can also be increased by increasing doping, but this has the disadvantage of resulting in increased depletion voltage. Depletion voltage is set by the product specifications, such as operating voltage and process tolerances. It cannot be increased without affecting other parameters. In particular, increasing depletion voltage above specifications contradicts with the requirement of full well depletion under reset operation, required for suppression of kTC noise and for increasing sensitivity. Improving the trade-off between well capacity and depletion voltage is therefore a fundamental challenge in scaled pixels.

A method for forming a photodiode cathode in an integrated circuit imager includes defining and implanting a photodiode cathode region with a photodiode cathode implant dose of a dopant species and defining and implanting an edge region of the photodiode cathode regions with a photodiode cathode edge implant dose of a dopant species to form a region of higher implant dose than the photodiode cathode implant dose.

BRIEF DESCRIPTION OF THE INVENTION

According to one aspect of the present invention, a method for forming a photodiode cathode in an integrated circuit imager includes defining and implanting a photodiode cathode region with a photodiode cathode implant dose of a dopant species and defining and implanting an edge region of the photodiode cathode regions with a photodiode cathode edge implant dose of a dopant species to form a region of higher impurity concentration than the photodiode cathode impurity concentration.

According to another aspect of the present invention, a method for forming a photodiode cathode in an integrated circuit imager includes defining and implanting a photodiode cathode region with a photodiode cathode implant dose of a dopant species and defining and implanting a region of the photodiode away from the edges of the photodiode cathode region with a counterdoping implant dose of a dopant species to form a region of net lower impurity concentration in regions away from the photodiode cathode edges than doping concentration at the photodiode cathode edges.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
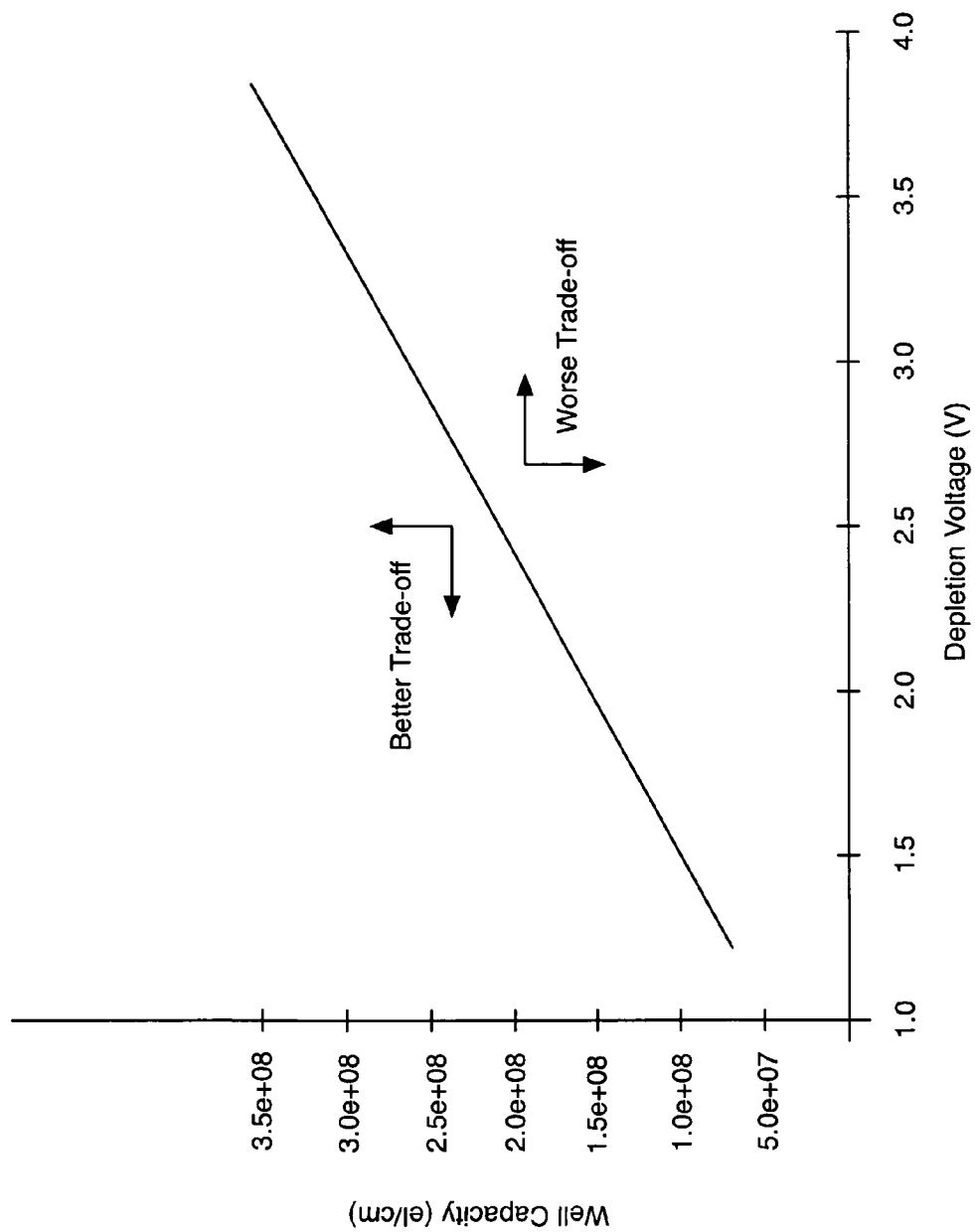
FIG. 1 is a graph showing well capacity of a two-dimensional cross section (e–/cm) as a function of depletion voltage for varying implant dose.

Referring now to FIG. 1, a graph shows well capacity (e–/cm) as a function of depletion voltage for a two-dimensional cross section of a photodiode. The schematic graph of FIG. 1 corresponds to a varying photodiode implant dose from between 6e12 to 1e13 cm$^2$. This plot reflects a fundamental physics of fully depleted p-n junction. As shown in FIG. 1, a better trade-off between well capacity and depletion voltage is obtained when well capacity increases (at fixed depletion voltage) and/or depletion voltage decreases (at fixed well capacity). Conversely, a worse trade-off between well capacity and depletion voltage is obtained when well capacity decreases and depletion voltage increases. Obtaining a better trade-off between well capacity and depletion voltage would significantly improve performance (dynamic range). This is a non-trivial task.

Figure 2:
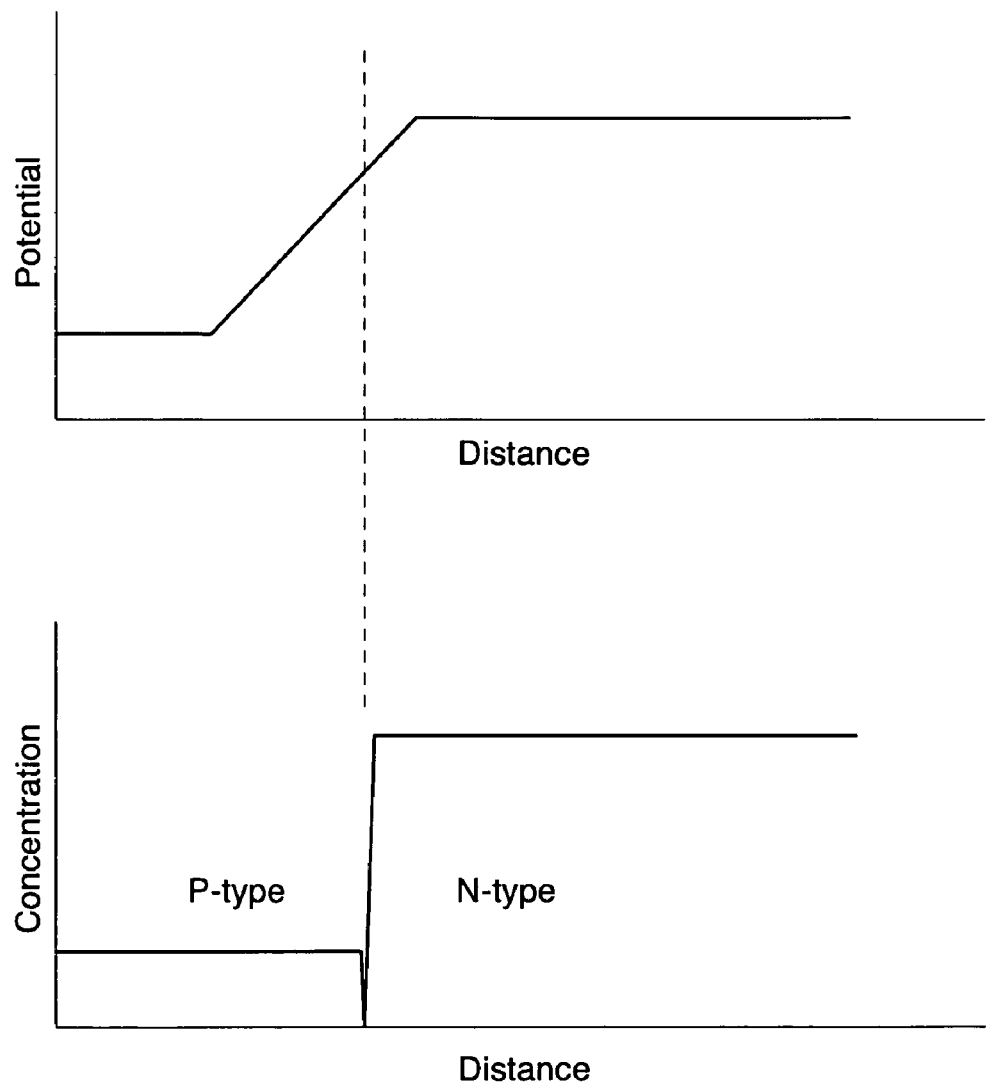
FIG. 2 is a pair of graphs showing potential and dopant concentration as a function of distance.

Referring now to FIG. 2, a pair of graphs showing potential and dopant concentration as a function of distance in a p-n junction with depleted n-type side. As may be seen from FIG. 2, the potential increases in the p-type material as the pn junction boundary is approached and continues to increase for a distance into the n-type material before leveling off.

Figure 3B:
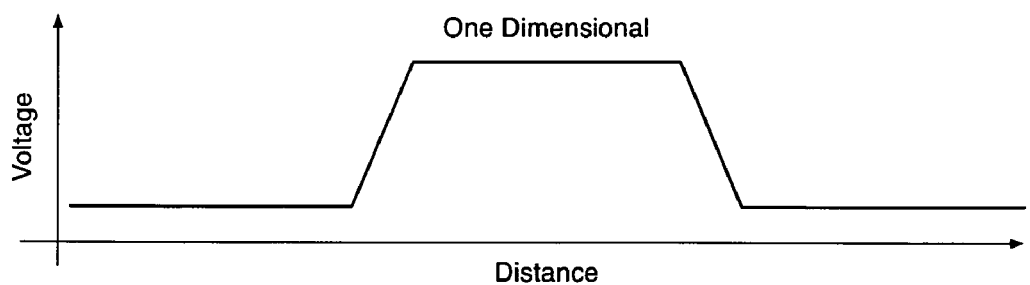
FIGS. 3A through 3C are diagrams representing electrostatic potential profiles from vertical and horizontal directions through a diode, respectively, in conventional pixels.
Figure 3C:
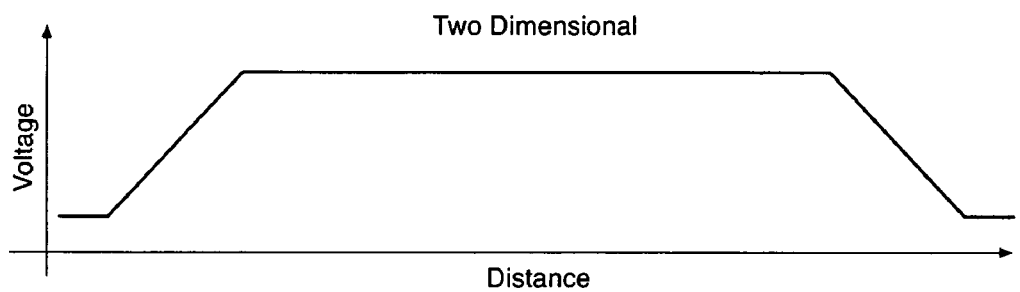
Figure 3A:
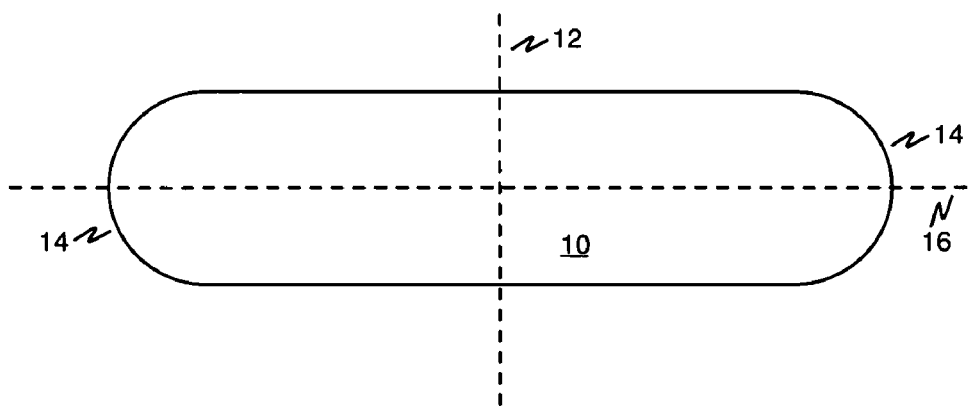

Referring now to FIGS. 3A through 3C, diagrams representing potential profiles from effectively one-dimensional and two-dimensional diodes, respectively, in conventional pixel wells. Portion 10 represents the n-type region of the diffusion away from the edges of the structure and portions 14 represent the p-type region of the diffusion at the edges of the structure. A "one-dimensional" direction through the diode diffusion 10 is shown along vertical dashed line 12 (y), shown in FIG. 3A and represents the conditions away from the edges of the well. As may be seen from the potential-versus-position curve for fully-depleted conditions along the width of the diode (x) shown in the curve 3B, the fully depleted potential is the same throughout the structure and drops off across the junction boundary.

A two-dimensional diode is represented at reference numerals 10 and 16 in FIG. 3A. FIGS. 3A through 3C show that because of two-dimensional effects, such as doping distribution, and two-dimensional electrostatic effects, narrow-width photodiode potential has a non-constant lateral distribution as shown in the voltage-versus-position curve of FIG. 3C, taken through horizontal dashed line 16. Two-dimensional portions of the diodes have a lower depletion voltage than the one-dimensional portions. Their contribution (normalized to area) to well capacity is lower than from a one-dimensional diode. The depletion voltage is set by the one-dimensional (wide) diode region, i.e. it is high.

According to one aspect of the present invention, a new method of improving the trade-off between well capacity and depletion voltage using lateral profile engineering is suggested. The techniques of the present invention make it possible to improve well capacity up to 30% or higher. Well capacity is a particular issue in imagers using correlated double sampling, CDS. CDS is used to reduce the noise from imager operation by removing the sampling noise. To do this the photodiode must be fully depleted when reset and during readout. The well capacity is the charge removed by the reset operation. The larger this charge, the more the dynamic range. The applicability of the present invention is universal, and may be applied to various technologies, such as CMOS image sensors, X3 sensors, CCD, etc.

Well capacity may be improved in accordance with the present invention by providing a photodiode having a higher doping level near the photodiode edges and/or corners.

Figure 4A:
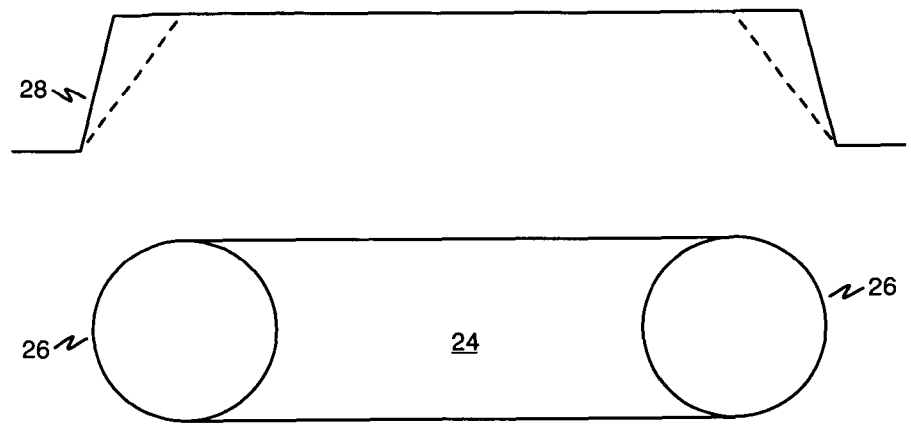
FIGS. 4A and 4B are, respectively, cross-sectional and top views of a pixel photodiode formed according to the principles of the present invention.
Figure 4B:
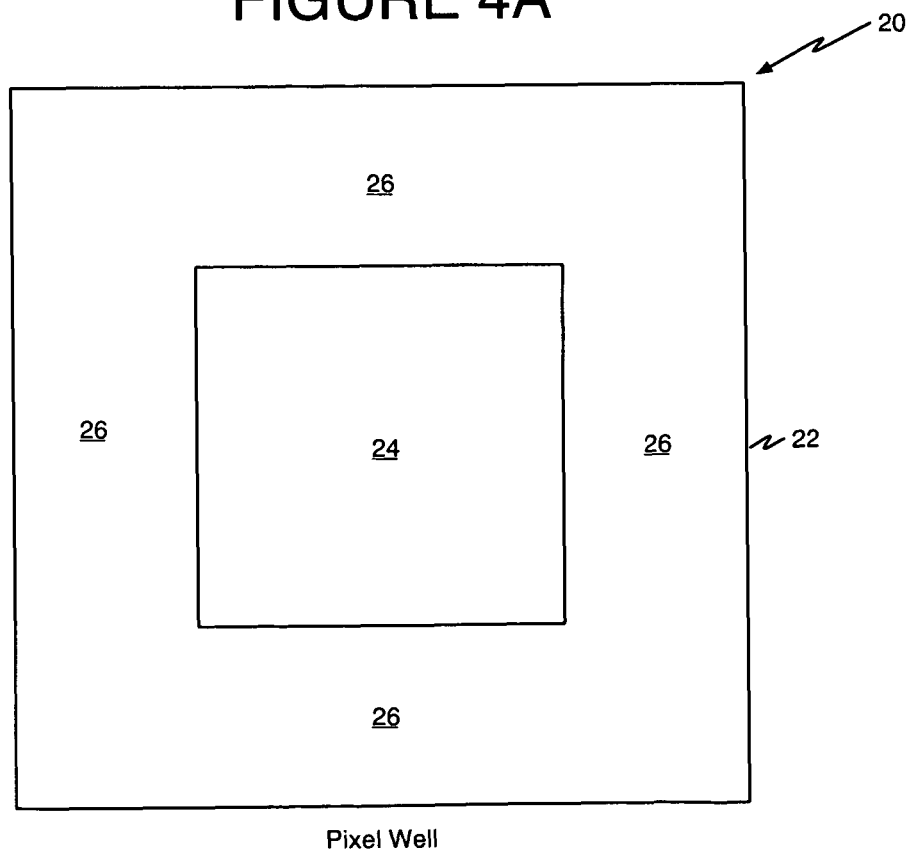

Referring now to FIGS. 4A and 4B, a cross-sectional view and a top view are respectively shown of a pixel photodiode 20 formed according to the principles of the present invention. The potential profile corresponding to full depletion conditions in FIG. 4A illustrates both conventional (dashed line) and proposed improved (solid line) photodiode designs. Photodiode cathode region 22 is formed from an n-type doped region disposed in a p-well. An inner portion 24 of the photodiode cathode region 22 is doped with an n-type dopant. An outer portion of photodiode cathode region 22 shown in region 26 is doped with an n-type dopant to a higher concentration than the concentration in the inner region 24.

Examination of the potential-versus-position curve 28 for photodiode 20 (solid line) shows that the potential profile resembles the curve for the one-dimensional diode of FIG. 3. The additional implant near the implant edges acts to increase the depletion voltage of edge component of the photodiode up to depletion voltage of center part of the photodiode, thus making the two-dimensional diode look more like a one-dimensional diode. The additional doping should not be so high that the potential in the more heavily doped edges in full depletion is allowed to go higher than the potential in a one-dimensional diode to avoid potential wells. The fact that the edge region with higher doping has the same depletion voltage as lower doped middle region (for optimally selected implant doses) is due to two-dimensional electrostatic effect at full depletion conditions. In other words, the center region is depleted from top and bottom p-n junctions, while the edge n-type region is depleted from top, bottom, and the side, and thus requires a higher doping to provide the same depletion voltage as the center photodiode region.

Figure 5:
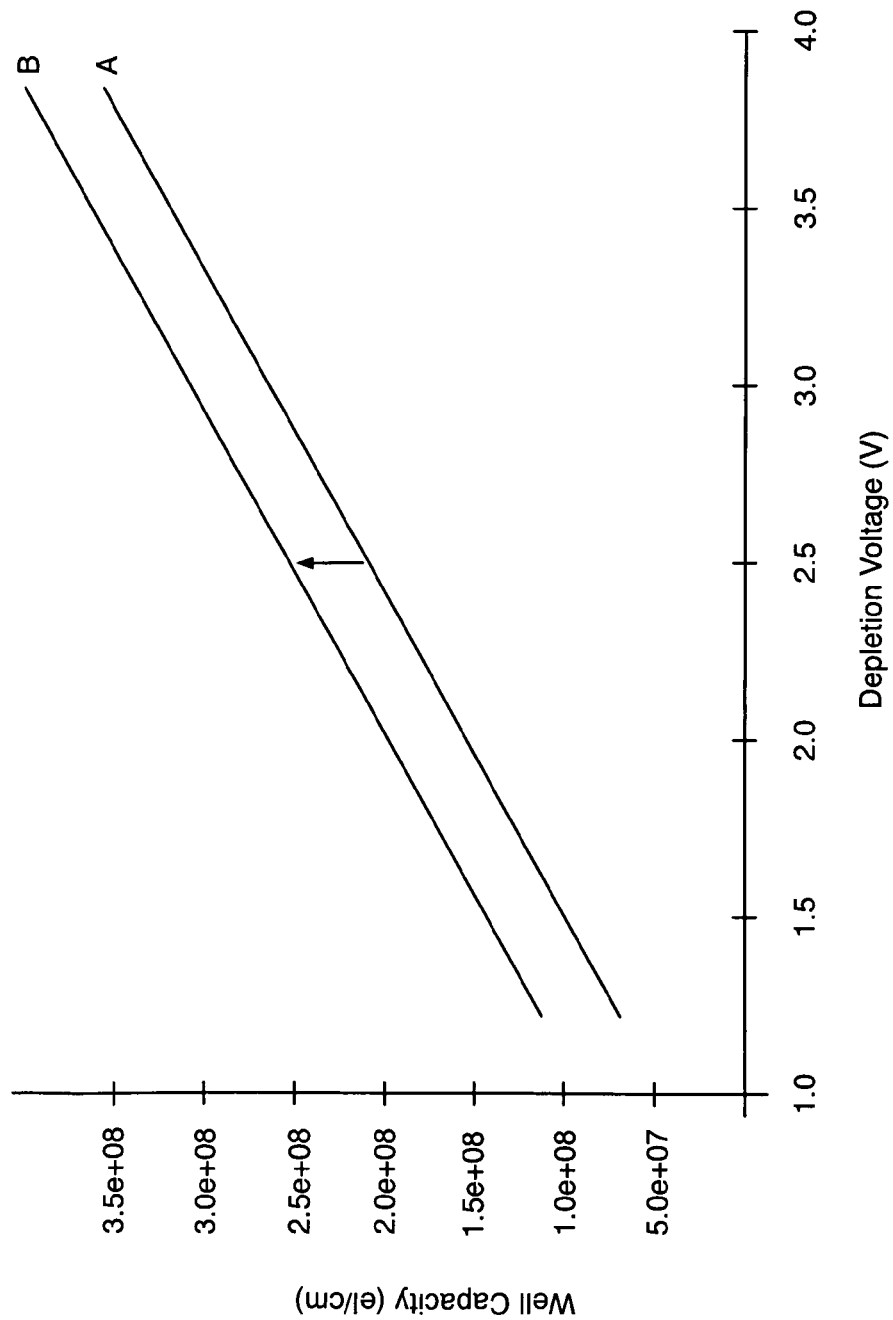
FIG. 5 is a graph showing the improvement in well capacity (e–/cm) as a function of depletion voltage obtained by using the present invention.

The net effect of the structures shown in FIGS. 4A and 4B is higher well capacity at about the same depletion voltage. In FIG. 4A, the dashed portion of the curve represents the potential as it would behave without higher doping at the edge region 26. This may be seen by an examination of FIG. 5, a graph showing well capacity (e−/cm) as a function of depletion voltage including the curve (A) of FIG. 1, and an additional curve (B) showing well capacity (e−/cm) as a function of depletion voltage for photodiodes according to the present invention. As may be seen in FIG. 5, curve B exhibits a greater well capacity for the same depletion voltage.

Figure 6:
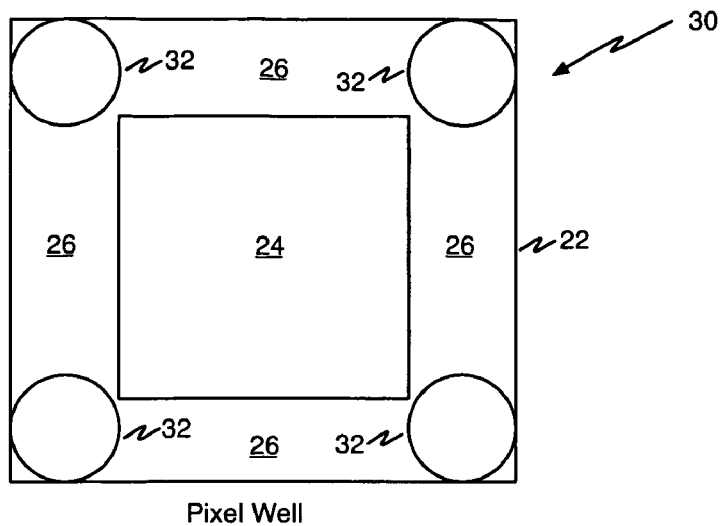
FIG. 6 is a top view of a pixel photodiode formed according to the principles of the present invention also including additional doping in the corners.

In very small pixels, three-dimensional depletion effect may be important, where depletion of the corners is affected by electric field from all three directions. In such cases extra doping may be performed in the corners of the diode cathode region in addition to the doping 26 at the edge. Referring now to FIG. 6, a top view shows a pixel photodiode 30 formed according to the principles of the present invention also including additional doping 32 in the corners of the photodiode cathode. Elements in FIG. 6 that are also depicted in FIG. 4B are identified with the same reference numerals used for those elements in FIG. 4B.

Thus photodiode cathode region 22 of photodiode 30 is formed from an n-type doped region disposed in a p-well. An inner portion 24 of the photodiode cathode region 22 is doped with an n-type dopant. An outer portion of photodiode cathode region 22 shown in region 26 is doped with an n-type dopant to a higher concentration than the concentration in the inner region 24.

The structure of the photodiode of the present invention may be formed by employing an additional mask for implanting the heavier dose at the edges of the diode. Such a technique is illustrated in FIGS. 7A and 7B.

Figure 7A:
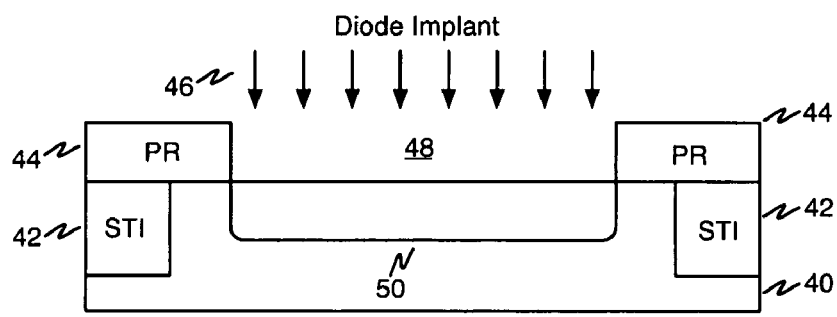
FIGS. 7A and 7B are cross sectional views of a partially-completed semiconductor structure illustrating one method for forming the photodiode of the present invention.

Referring first to FIG. 7A, substrate 40 has had shallow trench isolation regions 42 formed therein using techniques known in the art. However, the method suggested in this patent is not limited to any specific isolation technology. A layer of photoresist 44 is applied using conventional photolithography techniques. The diode implant, shown at arrows 46 is made through aperture 48 in photomask 44 to form diode cathode region 50.

Figure 7B:
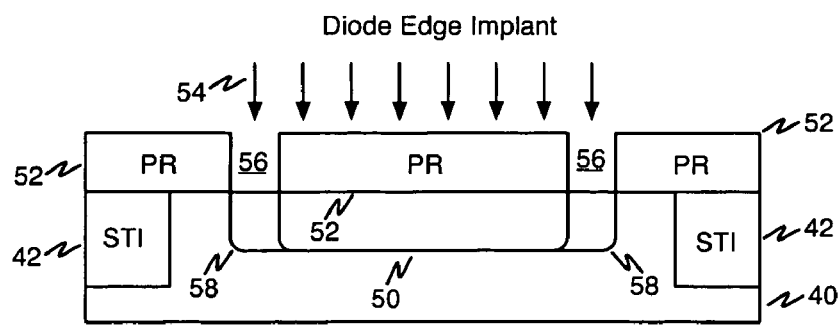

Next, as shown in FIG. 7B, photoresist layer 44 has been removed and another photomask 52 has been applied using conventional photolithography techniques. The edge implant, shown at arrows 54 is made through aperture 56 in photomask 52 to form diode cathode edge region 58. Following the processing shown in FIGS. 7A and 7B, conventional processing may be performed to complete the structure.

Figure 8:
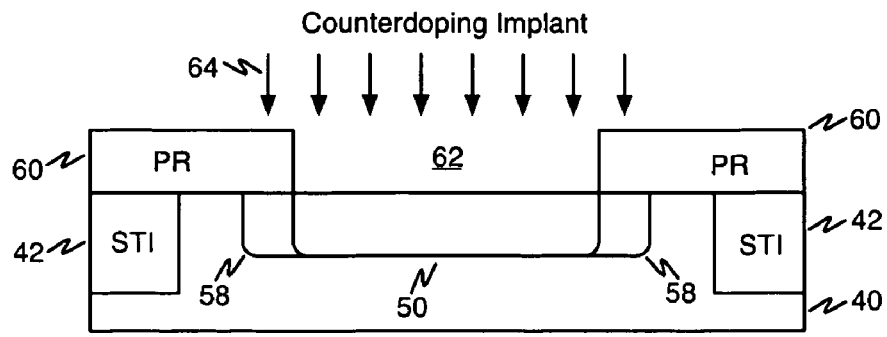
FIG. 8 is a cross sectional view of a partially-completed semiconductor structure illustrating another method for forming the photodiode of the present invention.
Figure 9A:
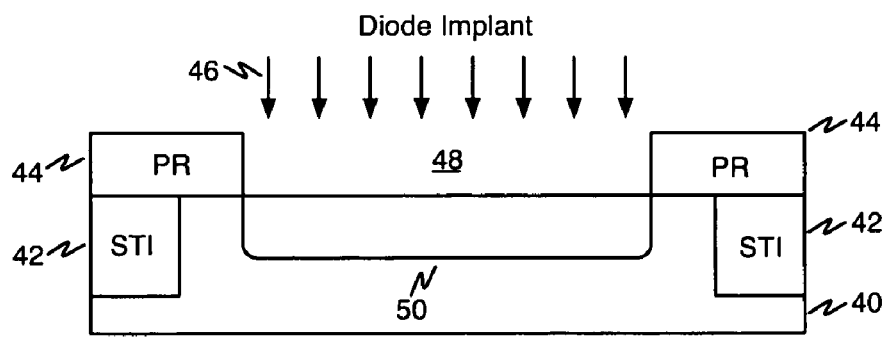
FIGS. 9A and 9B are cross-sectional views illustrating selected fabrication steps of another method that may be used to form a pixel photodiode according to the principles of the present invention, providing self-alignment of the implantation steps.
Figure 9B:
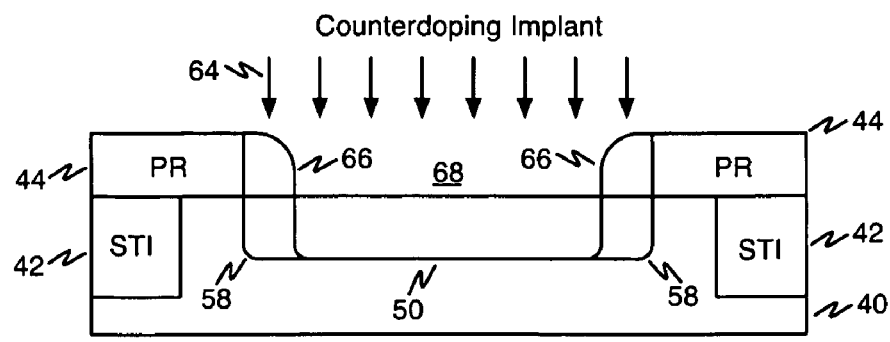

With very small diode structures, making narrow openings in thick photoresist for the extra edge implant may be difficult. As an alternative, a mask opening may be formed in the center of the photodiode, and dopant species of opposite conductivity type (p-type) may be employed to counter-dope the center of the photodiode. Several such methods according to the present invention are illustrated in FIGS. 8, 9A, and 9B. Elements in FIGS. 8, 9A, and 9B that are also depicted in FIGS. 7A and 7B are identified with the same reference numerals used for those elements in FIGS. 7A and 7B.

Referring now to FIG. 8, substrate 40 has had shallow trench isolation regions 42 formed therein using techniques known in the art. The diode implant has already been performed to form diode cathode region 50. A layer of photoresist 60 that exposes an aperture 62 inward from the edges of the diode cathode region 50 is applied using conventional photolithography techniques. A counterdoping implant of a p-type species, shown at arrows 64, is made through the aperture 62 in photomask 60 to partially counterdope diode cathode center region 50. Following the processing shown in FIG. 8, conventional processing may be performed to complete the structure.

Partial counter-doping of the central photodiode cathode region can be performed in a self-aligned manner to reduce misalignment of the mask edges and to reduce variability. The relevant portion of such a self-aligned process is illustrated in FIGS. 9A and 9B to which attention is now drawn.

Referring now to FIG. 9A, substrate 40 has had shallow trench isolation regions 42 formed therein using techniques known in the art. A layer of photoresist 44 is applied using conventional photolithography techniques. The diode implant, shown at arrows 46 is made through aperture 48 in photomask 44 to form diode cathode region 50.

Referring now to FIG. 9B, photoresist layer 44 is left in place following the photodiode cathode implant to form diode cathode region 50. A spacer 66 is formed in the aperture 48 to reduce its size. A counterdoping implant of a p-type species, shown at arrows 64, is made through the reduced-size aperture 68 in photomask 44 to counterdope diode cathode center region 50. Following the processing shown in FIG. 9B, conventional processing may be performed to complete the structure.

Examples of implants for the embodiment shown in FIGS. 7A and 7B include use of an n-type dopants such as As or P with a dose of about $7 \times 10^{12}/cm^2$ over the entire photodiode cathode area. The n-type dopant is also implanted with a dose of about $4 \times 10^{12}/cm^2$ into a peripheral gap having a width of about 0.1 microns.

In the counterdoping embodiment shown in FIGS. 9A and 9B, examples of implants include use of an n-type dopant such as As or P with a dose of about $1.1 \times 10^{1}/cm^2$ over the entire photodiode cathode area. The p-type counterdopant is then performed using a species such as boron with a dose of about $4 \times 10^{12}/cm^2$ through a spacer having a width of about 0.1 microns.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for forming a photodiode cathode in an integrated circuit imager including:
    defining and implanting a photodiode cathode region with a photodiode cathode implant dose of an n-type dopant species; and
    defining and implanting an edge region of the photodiode cathode regions region with a photodiode cathode edge implant dose of an n-type dopant species to form a region of higher impurity concentration than the photodiode cathode impurity concentration.

2. The method of claim 1 wherein the dopant species used to dope both the photodiode cathode region and the edge region of the photodiode cathode region is phosphorous.

3. The method of claim 1 wherein the dopant species used to dope both the photodiode cathode region and the edge region of the photodiode cathode region is arsenic.

4. The method of claim 1 wherein the photodiode cathode implant dose is between about $1 \times 10e12/cm^2$ and about $5 \times 10e13/cm^2$.

5. The method of claim 1 wherein the photodiode cathode edge implant dose is between about $1 \times 10e12/cm^2$ and about $4 \times 10e13/cm^2$.

6. A method for forming a photodiode cathode in an integrated circuit imager including:
    defining and implanting a photodiode cathode region with a photodiode cathode edge implant dose of a dopant species of a first conductivity type; and
    defining and implanting a center region of the photodiode cathode regions with an implant dose of a dopant species of a second conductivity type opposite that of the first conductivity type to form a partially counterdoped photodiode cathode center region.

7. The method of claim 6 wherein the first conductivity type is n-type.

8. The method of claim 7 wherein the dopant species of the first conductivity type is phosphorous.

9. The method of claim 7 wherein the dopant species of the first conductivity type is arsenic.

10. The method of claim 8 wherein the photodiode cathode implant dose is between about $1 \times 10e12/cm^2$ and about $5 \times 10e13/cm^2$.

11. The method of claim 8 wherein the dopant species of the second conductivity type is boron.

12. The method of claim 11 wherein the dose of the dopant of the second conductivity type is between about $1 \times 10e12/cm^2$ and about $4 \times 10e13/cm^2$.

13. The method of claim 6 wherein defining the center region comprises defining a center region within the photodiode cathode region that is smaller than the photodiode cathode region.

14. The method of claim 13 wherein defining the center region comprises defining a center region that is self aligned to the photodiode cathode region.

15. The method of claim 14 wherein defining a center region that is self aligned to the photodiode cathode region includes forming a spacer in an aperture in a mask used to define the photodiode cathode region.

16. A method for forming a photodiode cathode in an integrated circuit imager including:
    defining and implanting a photodiode cathode region with a photodiode cathode implant dose of an n-type dopant species; and
    defining and implanting corner regions of the photodiode cathode region with a photodiode cathode corner implant dose of an n-type dopant species to form a region of higher impurity concentration than the photodiode cathode impurity concentration.

17. The method of claim 16 wherein the dopant species is n-type.

18. The method of claim 16 wherein the dopant species is phosphorous.

19. The method of claim 16 wherein the dopant species is arsenic.

20. The method of claim 16 wherein the photodiode cathode corner implant dose is between about $1 \times 10e12/cm^2$ and about $5 \times 10e13/cm^2$.

21. The method of claim 16 wherein the photodiode cathode corner implant dose is between about $1 \times 10e12/cm^2$ and about $4 \times 10e13/cm^2$.

* * * * *